US009349876B2

(12) United States Patent
Hirano et al.

(10) Patent No.: US 9,349,876 B2
(45) Date of Patent: May 24, 2016

(54) NONVOLATILE SEMICONDUCTOR MEMORY

(71) Applicant: KABUSHIKI KAISHA TOSHIBA, Tokyo (JP)

(72) Inventors: Izumi Hirano, Kuwana (JP); Yuichiro Mitani, Kanagawa-Ken (JP); Masayasu Miyata, Kawasaki (JP); Yasushi Nakasaki, Yokohama (JP); Koichi Kato, Yokohama (JP); Daisuke Matsushita, Fujisawa (JP); Akira Takashima, Tokyo (JP); Misako Morota, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 14/108,633

(22) Filed: Dec. 17, 2013

(65) Prior Publication Data

US 2014/0167133 A1 Jun. 19, 2014

(30) Foreign Application Priority Data

Dec. 19, 2012 (JP) .................................. 2012-277254

(51) Int. Cl.
| | |
|---|---|
| *H01L 29/792* | (2006.01) |
| *H01L 21/28* | (2006.01) |
| *H01L 27/115* | (2006.01) |
| *H01L 29/423* | (2006.01) |
| *H01L 29/51* | (2006.01) |
| *H01L 29/788* | (2006.01) |

(52) U.S. Cl.
CPC ........ *H01L 29/792* (2013.01); *H01L 21/28273* (2013.01); *H01L 27/11521* (2013.01); *H01L 29/42332* (2013.01); *H01L 29/511* (2013.01); *H01L 29/7881* (2013.01); *H01L 29/7889* (2013.01); *H01L 21/28282* (2013.01); *H01L 27/11556* (2013.01)

(58) Field of Classification Search
CPC ............ H01L 21/8229; H01L 21/8239; H01L 2924/1438
See application file for complete search history.

(56) References Cited

U.S. PATENT DOCUMENTS

| | | | | |
|---|---|---|---|---|
| 6,165,916 A | * | 12/2000 | Muraoka et al. .............. | 438/791 |
| 6,243,295 B1 | * | 6/2001 | Satoh ................. | G11C 16/0483 |
| | | | | 257/E21.69 |
| 8,367,493 B1 | * | 2/2013 | Ngo et al. ..................... | 438/201 |

(Continued)

FOREIGN PATENT DOCUMENTS

| | | |
|---|---|---|
| JP | 2009-054951 | 3/2009 |
| JP | 2010-080646 | 4/2010 |

*Primary Examiner* — Allen Parker
*Assistant Examiner* — Wasiul Haider
(74) *Attorney, Agent, or Firm* — Finnegan, Henderson, Farabow, Garrett, Dunner, LLP

(57) ABSTRACT

A nonvolatile semiconductor memory according to an embodiment includes: a semiconductor region; a first insulating film formed on the semiconductor region; a charge storage film formed on the first insulating film; a hydrogen diffusion preventing film formed on the charge storage film; a second insulating film formed on the hydrogen diffusion preventing film; a control gate electrode formed on the second insulating film; a hydrogen discharge film formed on the control gate electrode; and a sidewall formed on a side surface of a multilayer structure including the first insulating film, the charge storage film, the hydrogen diffusion preventing film, the second insulating film, and the control gate electrode, the sidewall containing a material for preventing hydrogen from diffusing.

9 Claims, 14 Drawing Sheets

(56) References Cited

U.S. PATENT DOCUMENTS

| | | | |
|---|---|---|---|
| 2002/0149050 A1* | 10/2002 | Fazio et al. | 257/314 |
| 2008/0211005 A1* | 9/2008 | Akahori | 257/316 |
| 2010/0038699 A1* | 2/2010 | Katsumata et al. | 257/324 |
| 2010/0052039 A1* | 3/2010 | Matsushita | H01L 21/28282 257/324 |
| 2011/0073935 A1* | 3/2011 | Sekihara et al. | 257/325 |
| 2011/0127597 A1* | 6/2011 | Fukuzumi et al. | 257/314 |
| 2012/0018792 A1* | 1/2012 | Matsushita et al. | 257/316 |
| 2012/0025297 A1* | 2/2012 | Takashima et al. | 257/324 |

* cited by examiner

US 9,349,876 B2

NONVOLATILE SEMICONDUCTOR MEMORY

CROSS REFERENCE TO RELATED APPLICATIONS

This application is based upon and claims the benefit of priority from the prior Japanese Patent Application No. 2012-277254, filed on Dec. 19, 2012, the entire contents of which are incorporated herein by reference.

FIELD

Embodiments described herein relate generally to a nonvolatile semiconductor memory.

BACKGROUND

NAND flash memory is known as one type of nonvolatile semiconductor memory. The cell structure of a NAND flash memory is a stacked gate structure with a first insulating film, a charge storage film, a second insulating film, and a control gate electrode stacked on a semiconductor layer in this order. The first insulating film is also called a "tunnel insulating film." The second insulating film is called an "intergate insulating film" when the charge storage film is a floating gate electrode formed of polycrystalline silicon, and called a "block insulating film" when the charge storage film is an insulating film that stores charge.

Conventionally, the first insulating film and the second insulating film have been formed of silicon oxide or silicon oxynitride. However, as flash memories tend to decrease in size and increase in capacity, the interference between cells becomes more remarkable in rocket-type cells. For this reason, the employment of a planar cell structure instead of the rocket-type cell structure is being studied. However, silicon oxide or silicon oxynitride that has been conventionally used to form the second insulating film is, in the case of a planar cell structure, insufficient to ensure the coupling ratio and to maintain the insulation between the floating gate electrode or charge storage film and the control gate electrode. Therefore, a material of even higher dielectric constant needs to be used. Due to its high dielectric constant, wide bandgap, and high thermal stability, the application of a lanthanum aluminum silicon oxide film to the second insulating film is pursued.

However, the requirements of the second insulating film are not only a low leakage current but also a high breakdown voltage and a low charge-trapping capability. It is therefore important to improve the reliability of the high-k material used to form the second insulating film. Besides ensuring the reliability of the second insulating film, preventing the degradation of the first insulating film caused by write and erase operations is necessary in order to improve the reliability of the memory cell itself. As has been described, a nonvolatile semiconductor memory having highly reliable memory cells is required.

DETAILED DESCRIPTION

A nonvolatile semiconductor memory according to an embodiment includes: a semiconductor region; a first insulating film formed on the semiconductor region; a charge storage film formed on the first insulating film; a hydrogen diffusion preventing film formed on the charge storage film; a second insulating film formed on the hydrogen diffusion preventing film; a control gate electrode formed on the second insulating film; a hydrogen discharge film formed on the control gate electrode; and a sidewall formed on a side surface of a multilayer structure including the first insulating film, the charge storage film, the hydrogen diffusion preventing film, the second insulating film, and the control gate electrode, the sidewall containing a material for preventing hydrogen from diffusing.

Before the embodiments are described, the course of events for achieving the embodiments will be described below.

Figure 1:
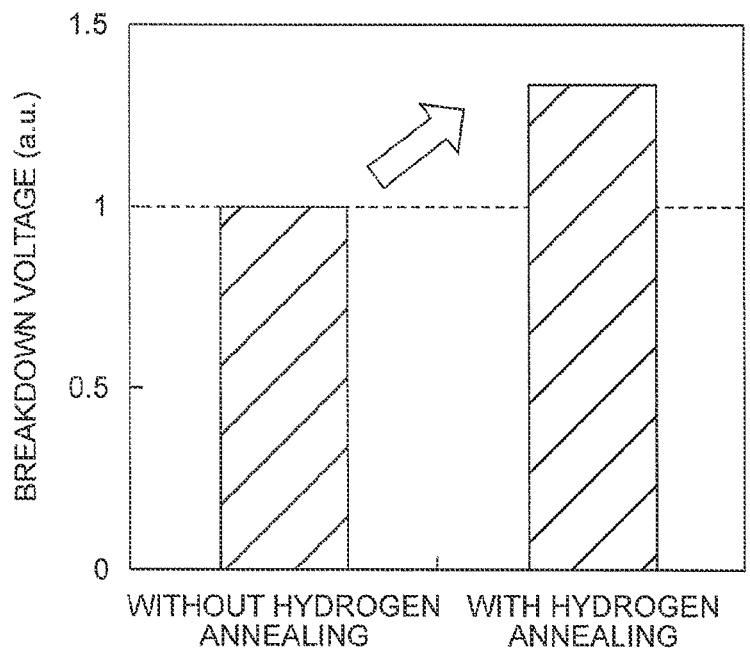
FIGS. 1(a) and 1(b) are drawings showing the breakdown voltage of a lanthanum aluminum silicon oxide film and the charge-trapping amount in a lanthanum aluminum silicon oxide film.
Figure 1:
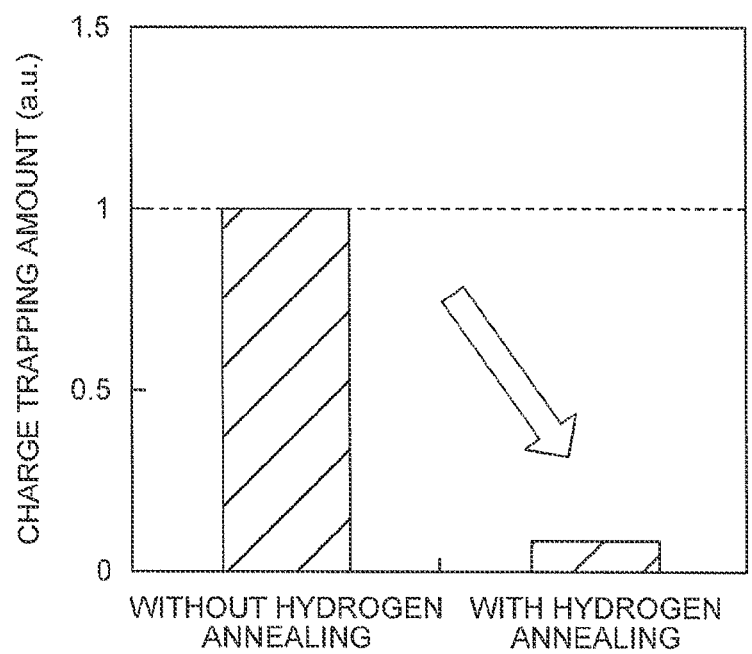

FIGS. 1(a) and 1(b) show the change in breakdown voltage in a lanthanum aluminum silicon oxide film (LaAlSiO film) and the change in the charge-trapping amount in a film capable of trapping charge between the case where hydrogen annealing is performed and the case where the hydrogen annealing is not performed. As can be understood from FIGS. 1(a) and 1(b), the breakdown voltage increases by about 35% and the charge-trapping amount decreases to less than a tenth by the hydrogen annealing. The reason for this is considered to be the hydrogen termination of defects in the lanthanum aluminum silicon oxide film. The defects in the film are considered to be terminated more efficiently with hydrogen when hydrogen in the radical state enters the film. If it is assumed that the lanthanum aluminum silicon oxide film contains hydrogen uniformly, the volume density of the hydrogen in the lanthanum aluminum silicon oxide film calculated by the charge-trapping amount in the lanthanum aluminum silicon oxide film, which is reduced due to the hydrogen, is about $9.3 \times 10^{20}/cm^3$.

On the other hand, it is reported that when hydrogen in the radical state enters a silicon oxide film forming a tunnel insulating film, the bond between silicon and hydrogen in the silicon oxide film is broken, leading to the degradation of the silicon oxide film. Therefore, in order to improve the reliability of memory cells, it is necessary to employ the structure by which hydrogen is introduced into the lanthanum aluminum silicon oxide film that serves as the intergate insulating film, but not into the tunnel insulating film formed of silicon oxide.

In order to achieve this, the present inventors have conceived the gate structure described below as the structure of a highly reliable flash memory. The gate structure includes, above the control gate electrode, a hydrogen discharge film that tends to discharge hydrogen easily, and a hydrogen block film that blocks hydrogen to prevent the hydrogen from diffusing below, or hydrogen absorption film between the lanthanum aluminum silicon oxide film that serves as the intergate insulating film and the floating gate electrode. Furthermore, the gate structure includes a layer for blocking hydrogen on the sidewalls of the control gate electrode, the intergate insulating film, the hydrogen block film, the floating gate electrode, and the tunnel insulating film in order to prevent hydrogen around the cells from diffusing into the tunnel insulating film. With such a structure, the defects of the intergate insulating film can be hydrogen-terminated with the degradation of the tunnel insulating film being prevented. This leads to improving write and erase characteristics and preventing the degradation in data retention, thereby enabling the improvement in the reliability of the entire memory cell.

Hereinafter, embodiments will be described in detail with reference to the accompanying drawings. In the following descriptions, the same reference numerals are assigned to the same elements, and repeated explanation is omitted. Each drawing is a schematic drawing, and therefore the shape, the size, and the ratio of each element may be different from those of the actual device. However, in manufacturing the actual device, they can be determined in consideration of the following descriptions and the well-known techniques.

First Embodiment

Figure 2:
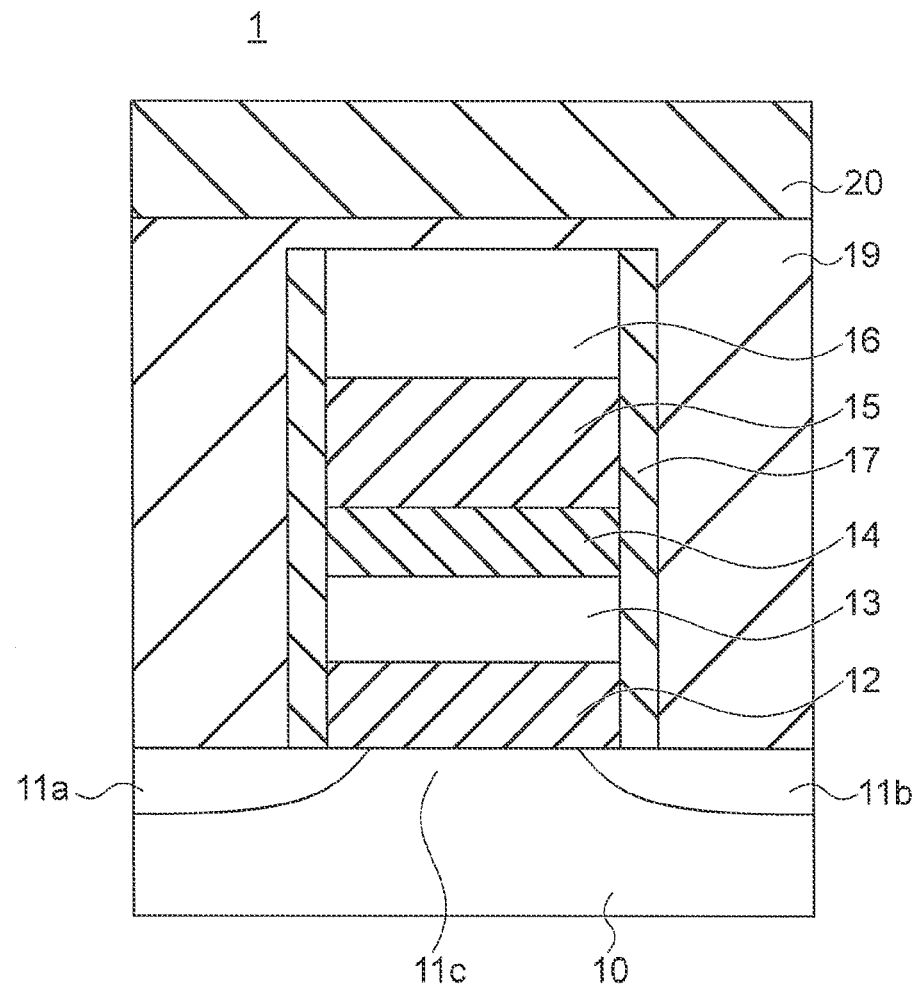
FIG. 2 is a cross-sectional view showing a memory cell according to a first embodiment.

A nonvolatile semiconductor memory (hereinafter also simply referred to as "memory") according to the first embodiment will be described with reference to FIG. 2. The memory of the first embodiment includes at least one memory cell, FIG. 2 shows a sectional view of the memory cell in the channel length direction. The memory cell 1 according to the first embodiment is a floating gate (FG) type memory cell, in which the charge storage film is a floating gate electrode. The memory cell 1 includes a source region 11a and a drain region 11b that are spaced apart from each other on a p-type semiconductor layer (semiconductor region) 10, a tunnel insulating film 12 formed on a region (channel region 11c) between the source region 11a and the drain region 11b of the p-type semiconductor layer 10, a charge storage film 13 formed on the tunnel insulating film 12, a hydrogen diffusion preventing film (hydrogen block film) 14 formed on the charge storage film 13, an intergate insulating film 15 formed on the hydrogen diffusion preventing film 14, and a control gate electrode 16 formed on the intergate insulating film 15. Gate sidewalls 17 are also formed on the side surfaces of the stacked gate structure including the tunnel insulating film 12, the charge storage film 13, the intergate insulating film 15, and the control gate electrode 16. An interlayer insulating film 19 is formed on the control gate electrode 16. It is preferable that a hydrogen discharge film 20 be formed on the interlayer insulating film 19. The interlayer insulating film 19 is formed to cover the stacked gate structure and the gate sidewalls 17. In this embodiment, for example, the tunnel insulating film 12 is a silicon oxide film, the charge storage film 13 is a polycrystalline silicon film, and the intergate insulating film 15 is a lanthanum aluminum silicon oxide film. Furthermore, the hydrogen diffusion preventing film 14, the gate sidewalls 17, and the hydrogen discharge film 20 are, for example, silicon nitride films that block hydrogen. The hydrogen discharge film 20 can be formed directly on the control gate electrode 16.

Figure 3:
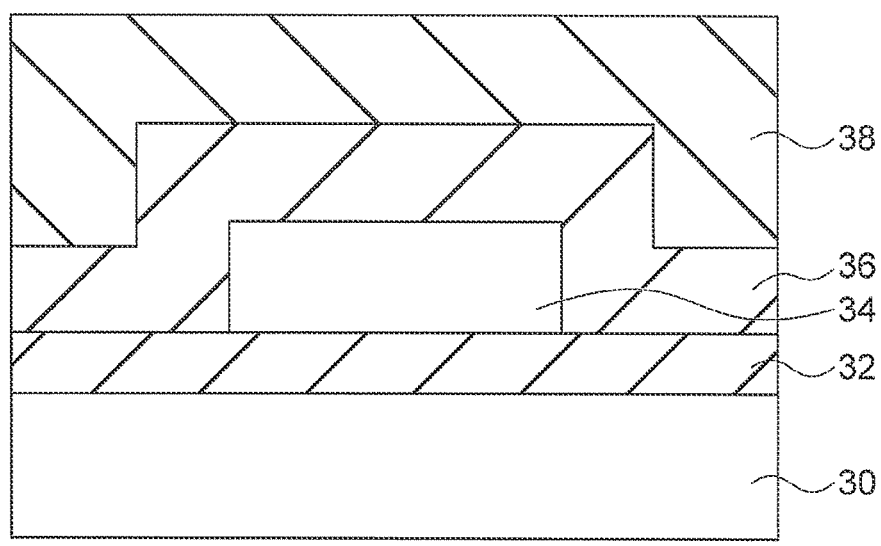
FIG. 3 is a cross-sectional view of a multilayer structure used to study the influence of a silicon nitride film on a silicon oxide film located underneath.
Figure 4:
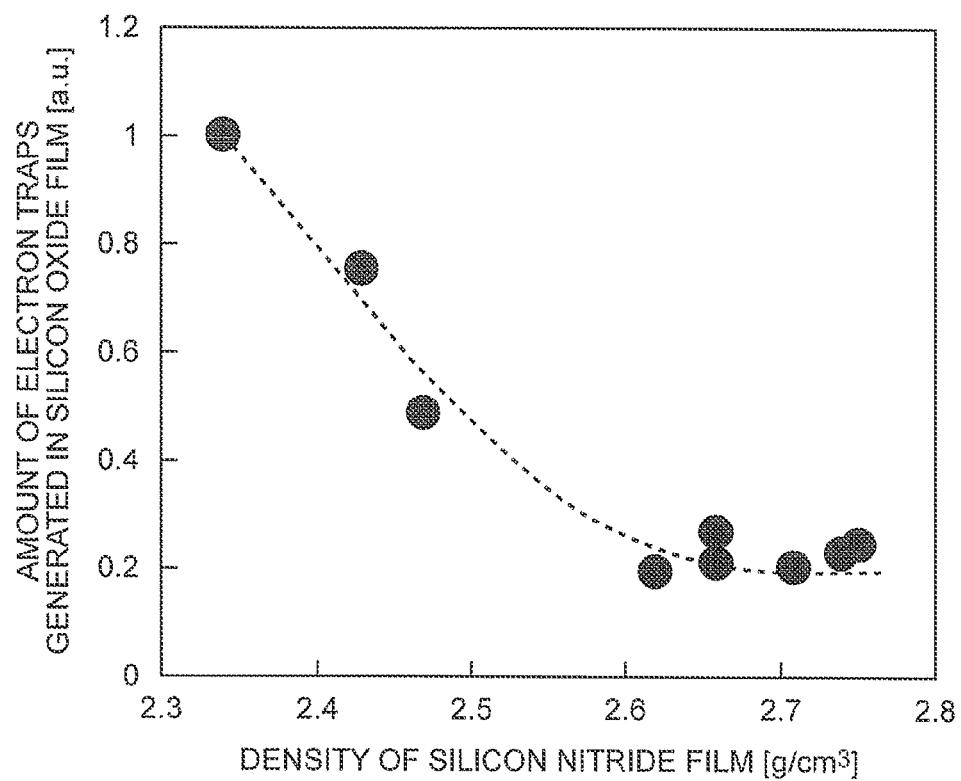
FIG. 4 is a drawing showing the correlation between the density of a silicon nitride film and the degradation amount of a silicon oxide film.
Figure 5:
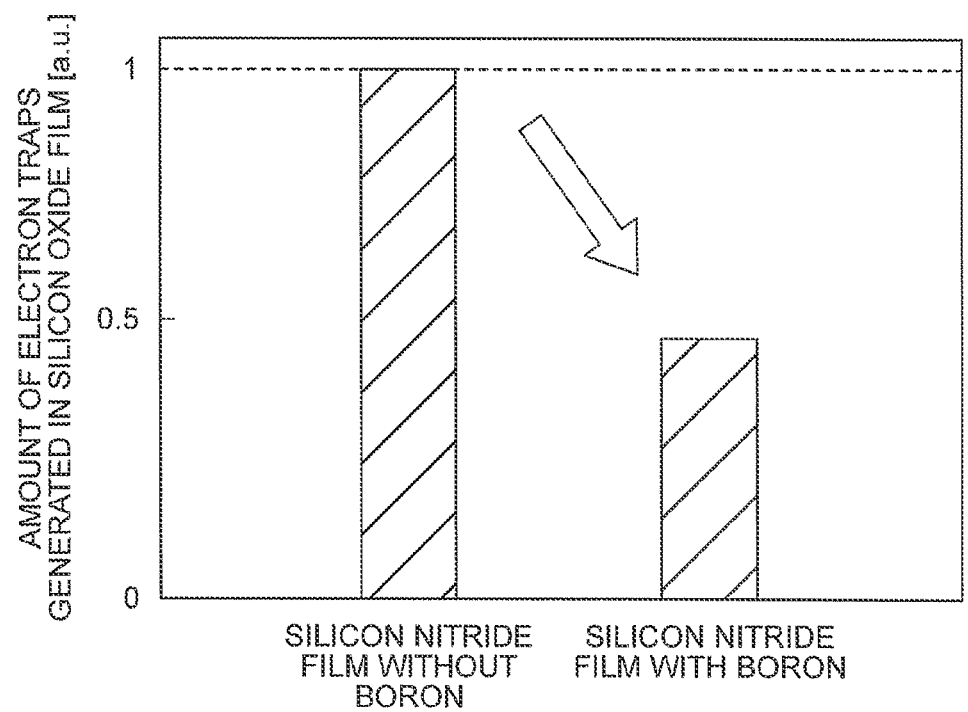
FIG. 5 is a drawing showing the degradation amount of a silicon oxide film when boron is added to the silicon nitride film.

Next, a preferable silicon nitride film to be used as the hydrogen diffusion preventing film 14, the gate sidewall 17, and the hydrogen discharge film 20 will be described with reference to FIGS. 3 to 5. First, as shown in FIG. 3, a multilayer structure is formed by depositing a silicon oxide film 32, a polycrystalline silicon electrode 34, an interlayer insulating film 36, and a silicon nitride film 38 on a silicon semiconductor layer 30. The degradation amount of the silicon oxide film 32 is studied in a case where the above multilayer structure is annealed under a nitrogen atmosphere at a temperature of 400° C. for 20 minutes, and a stress is applied to the silicon oxide film 32 by applying a voltage to the polycrystalline silicon electrode 34. The "degradation amount of the silicon oxide film" means the amount of electron traps generated in the silicon oxide film when a stress is applied to it. FIG. 4 is a correlation diagram between the density of the silicon nitride film 38 and the degradation amount of the silicon oxide film 32. The horizontal axis in FIG. 4 shows the density of the silicon nitride film 38, and the vertical axis shows the amount of electron traps generated in the silicon oxide film 32. The electron traps are considered to be generated due to hydrogen diffused from the silicon nitride film 38. It can be understood from FIG. 4 that when the film density of the silicon nitride film 38 is 2.6 g/cm³ or less, a large amount of hydrogen is discharged to accelerate the degradation of the silicon oxide film 32. It can also be understood that when the density of the silicon nitride film 38 is more than 2.6 g/cm³, the discharge of hydrogen is suppressed, and the degradation of the silicon oxide film 32 is also suppressed.

From the foregoing, it is preferable that a silicon nitride film having a density of 2.6 g/cm³ or less be used as the hydrogen discharge film 20 of the memory cell 1 according to the first embodiment shown in FIG. 2. The reason is as follows. The hydrogen discharged from the hydrogen discharge film 20 in the memory cell 1 according to the first embodiment diffuses downward to enter the intergate insulating film 15 that is a lanthanum aluminum silicon oxide film. The hydrogen terminates the defects (e.g., oxygen vacancies) in the lanthanum aluminum silicon oxide film 15. In this manner, the film quality of the intergate insulating film 15 is improved, and the reliability of the memory cell is improved.

A high-density silicon nitride film is used to form the hydrogen diffusion preventing film 14 between the charge storage film 13 and the intergate insulating film 15. The high density means a density of more than 2.6 g/cm³. If the hydrogen diffusion preventing film 14 of silicon nitride has a high density, the hydrogen diffusing from above can be blocked and prevented from entering the tunnel insulating film 12. This can improve the reliability of the memory cell.

The degradation amount of the silicon oxide film 32 in a case where boron (B) is added to the silicon nitride film 38 of the multilayer structure shown in FIG. 3, and then a stress is applied to the silicon oxide film 32, will be described with reference to FIG. 5. The amount of boron added to the silicon nitride film 38 is about 2 at %. As can be understood from Hg. 5, the addition of boron to the silicon nitride film 38 has an effect of suppressing hydrogen discharge. The cause of this effect is considered to be that the N—H bonds on the surfaces of the vacancies in the silicon nitride film 38 are replaced with the B—N bonds. Therefore, the hydrogen diffusion preventing film 14 of silicon nitride is also considered to have an effect of suppressing hydrogen discharge when boron is added thereto.

When a boron-doped p-type polycrystalline silicon is used to form the charge storage film 13, there is a problem in that boron in the polycrystalline silicon film serving as the charge storage film 13 is lost during a heat treatment, thereby decreasing the impurity concentration of the charge storage film 13. However, if a boron-doped silicon nitride film is used to form the hydrogen diffusion preventing film 14 as in this embodiment, it is possible to prevent the boron from diffusing upward from the charge storage film 13, thereby preventing the decrease in impurity concentration of the polycrystalline silicon in the charge storage film 13.

The hydrogen diffusion preventing film 14 in this embodiment is a silicon nitride film. However, the diffusion of hydrogen into the tunnel insulating film 12 can be prevented by using an alloy containing at least one hydrogen-absorbing element selected from the group consisting of Ti, Zr, Hf, and La and at least one element selected from the group consisting of Ni, Mn, Cr, and V to form the hydrogen diffusion preventing film 14.

If a high-density silicon nitride film, i.e., a silicon nitride film having a density of more than 2.6 g/cm$^3$, or a boron-doped silicon nitride film is used to form a sidewall 17, an effect of suppressing the diffusion of silicon into the lanthanum aluminum silicon oxide film serving as the intergate insulating film 15 is obtained, as compared to the case where the sidewall is formed of an ordinary silicon oxide film. In this manner, it is possible to stabilize the composition of the lanthanum aluminum silicon oxide film.

Next, a method of manufacturing a nonvolatile semiconductor memory according to the first embodiment will be described with reference to FIGS. 6 to 11. FIGS. 6 to 11 are cross-sectional views along the channel length direction.

Figure 6:
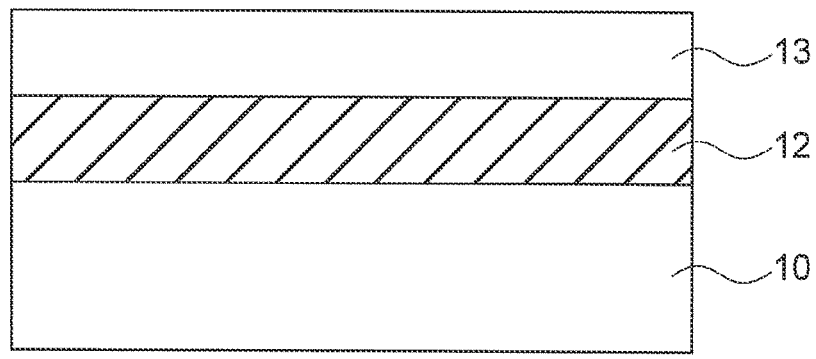
FIG. 6 is a cross-sectional view showing a method of manufacturing the nonvolatile semiconductor memory according to the first embodiment.

First, a tunnel insulating film 12 and a charge storage film 13 are sequentially formed on a silicon layer 10 as shown in FIG. 6. The tunnel insulating film 12 can be formed by thermally oxidizing the silicon layer 10, and the charge storage film 13 can be formed by chemical vapor deposition (CVD) using, for example, polycrystalline silicon.

Figure 7:
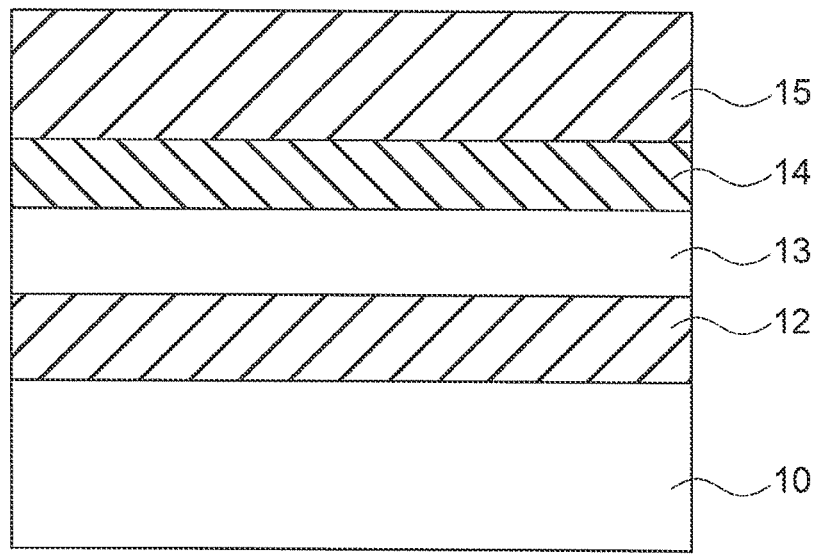
FIG. 7 is a cross-sectional view showing the method of manufacturing the nonvolatile semiconductor memory according to the first embodiment.

Subsequently, a silicon nitride film to serve as a hydrogen diffusion preventing film 14 is deposited on the charge storage film 13, as shown in FIG. 7. The silicon nitride film 14 can be formed using a known film deposition technique such as a plasma CVD method, a thermal CVD method, an atomic layer deposition (ALD) method, and a sputtering method. A lanthanum aluminum silicon oxide film to serve as an intergate insulating film 15 is deposited on the silicon nitride film 14. The lanthanum aluminum silicon oxide film 15 can be formed by using a known deposition method such as a sputtering method, a CVD method, and an ALD method. The lanthanum aluminum silicon oxide film can also be formed by depositing a lanthanum aluminum oxide film on a silicon oxide film deposited on the hydrogen diffusion preventing film 14, and performing a heat treatment in a nitrogen atmosphere at a temperature of 950° C. for 30 seconds. The heat treatment may not be performed immediately after the lanthanum aluminum oxide film is deposited.

Figure 8:
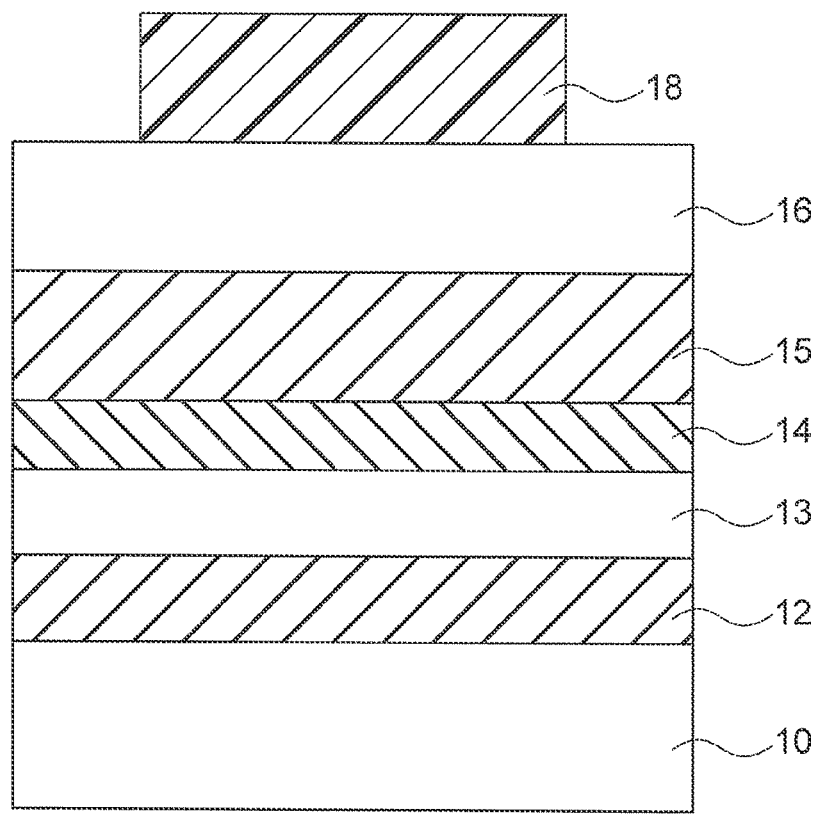
FIG. 8 is a cross-sectional view showing a method of manufacturing the nonvolatile semiconductor memory according to the first embodiment.

Subsequently, a control gate electrode 16 is formed on the intergate insulating film 15, and a resist pattern 18 of a photoresist in a gate shape is formed on the control gate electrode 16, as shown in FIG. 8.

Figure 9:
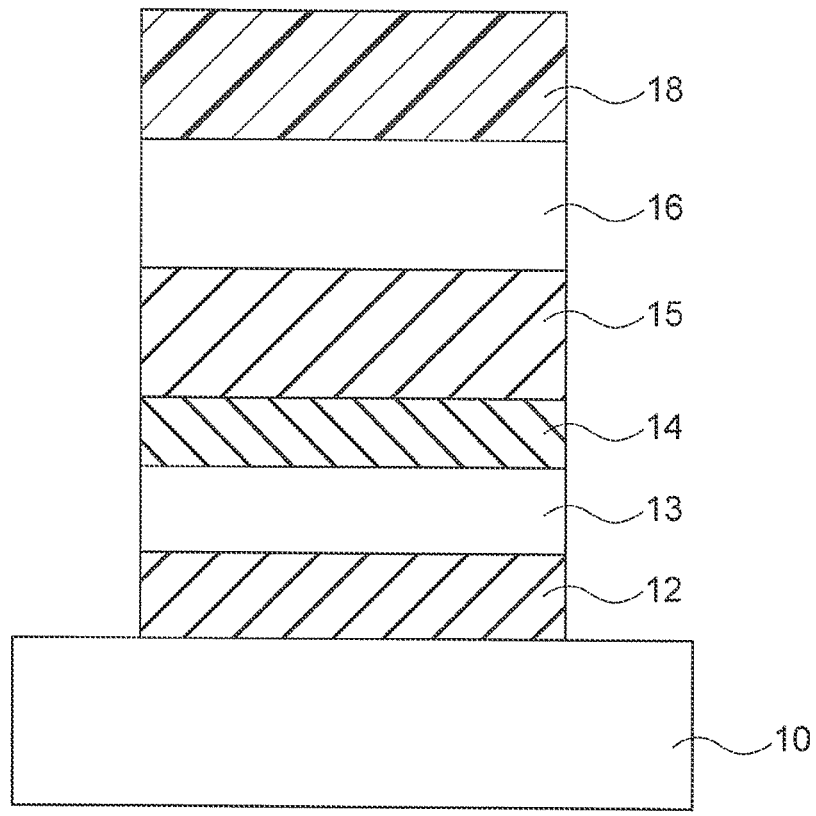
FIG. 9 is a cross-sectional view showing a method of manufacturing the nonvolatile semiconductor memory according to the first embodiment.

Thereafter, the control gate electrode 16, the intergate insulating film 15, the hydrogen diffusion preventing film 14, the charge storage film 13, and the tunnel insulating film 12 are sequentially etched and patterned by a reactive ion etching (RIE) method using the resist pattern 18 as a mask, as shown in FIG. 9, to form a stacked gate structure including the tunnel insulating film 12, the charge storage film 13, the hydrogen diffusion preventing film 14, the intergate insulating film 15, and the control gate electrode. Then, the resist pattern 18 is removed.

Figure 10:
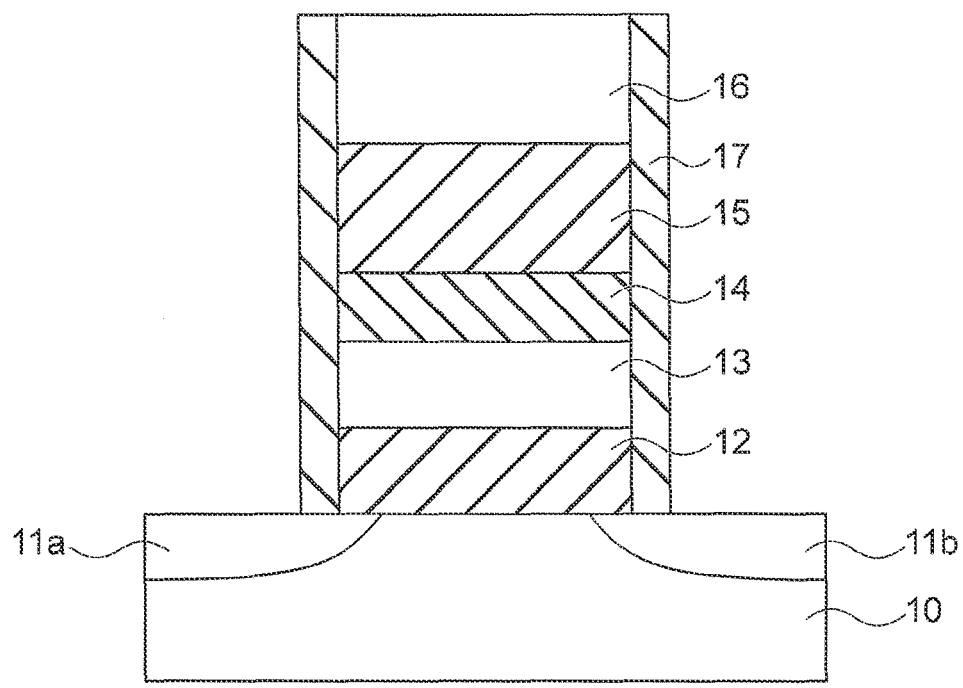
FIG. 10 is a cross-sectional view showing a method of manufacturing the nonvolatile semiconductor memory according to the first embodiment.

Next, sidewalls 17 of silicon nitride are formed on the side surfaces of the control gate electrode 16, the intergate insulating film 15, the hydrogen diffusion preventing film 14, the charge storage film 13, and the tunnel insulating film 12 that have been patterned, as shown in FIG. 10. At this time, silicon nitride is also formed on the control gate electrode 16, which should be removed by RIE.

Subsequently, n-type impurity ions are injected to the silicon semiconductor layer 10 using the stacked gate structure and the sidewalls 17 as masks to form a source region 11a and a drain region 11b in the silicon semiconductor layer 10.

Figure 11:
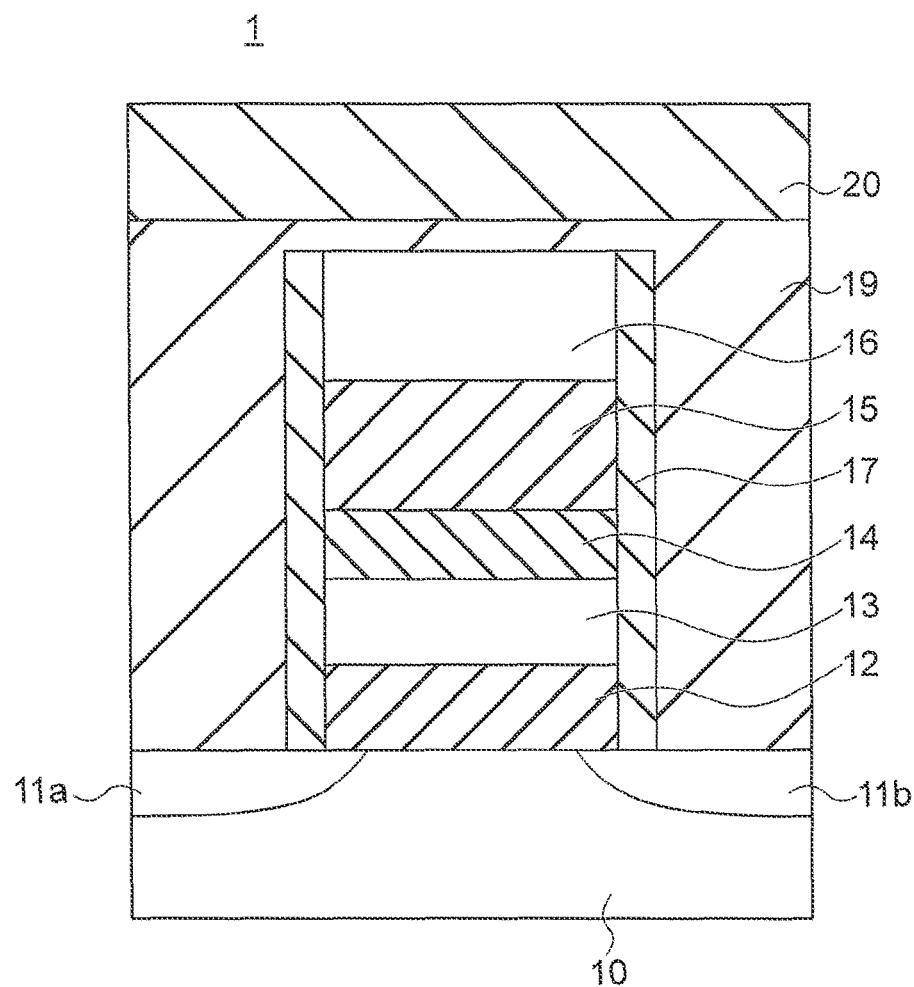
FIG. 11 is a cross-sectional view showing a method of manufacturing the nonvolatile semiconductor memory according to the first embodiment.

Then, an interlayer insulating film 19 is formed to cover the stacked gate structure and the sidewalls 17, as shown in FIG. 11. Thereafter, a low-density silicon nitride film 20 to serve as a hydrogen discharge film 20 is deposited on the interlayer insulating film 19. The silicon nitride film 20 can be formed by a known deposition technique such as a plasma CVD method, a thermal CVD method, an ALD method, and a sputtering method. After the hydrogen discharge film 20 is deposited, a heat treatment is performed in a nitrogen atmosphere, for example, at a temperature of 400° C. for 20 minutes. This step may not be performed immediately after the hydrogen discharge film 20 is deposited. In this manner, the memory cell 1 according to the first embodiment can be formed.

As described above, according to the first embodiment, the diffusion of hydrogen into the tunnel insulating film can be prevented by forming the hydrogen diffusion preventing film between the charge storage film and the intergate insulating film, thereby preventing the degradation of the tunnel insulating film and improving the reliability of the memory cell.

Furthermore, the film quality of the intergate insulating film of lanthanum aluminum silicon oxide can be improved by forming the hydrogen discharge film on the control gate electrode. This leads to the improvement in the reliability of the memory cell.

The nonvolatile semiconductor memory according to the first embodiment can be formed as a well-known NAND flash memory by connecting a plurality of memory cells 1 according to the first embodiment in series to form a NAND string. An ordinary NAND flash memory includes a plurality of NAND strings. In one NAND string, adjacent two memory cells 1 share the source region or drain region.

(Modification)

A memory according to a modification of the first embodiment will be described with reference to FIG. 12. The memory according to the modification includes a plurality of NAND strings arranged in a matrix form. In each NAND string, memory cells as described in the descriptions of the first embodiment are connected in series. A word line WL is formed of the control gate electrodes of memory cells located on the same row in NAND strings arranged on the same row. In more detail, the control gate electrodes 16 of the memory cells located on the same row are commonly connected to form a word line WL.

Figure 12:
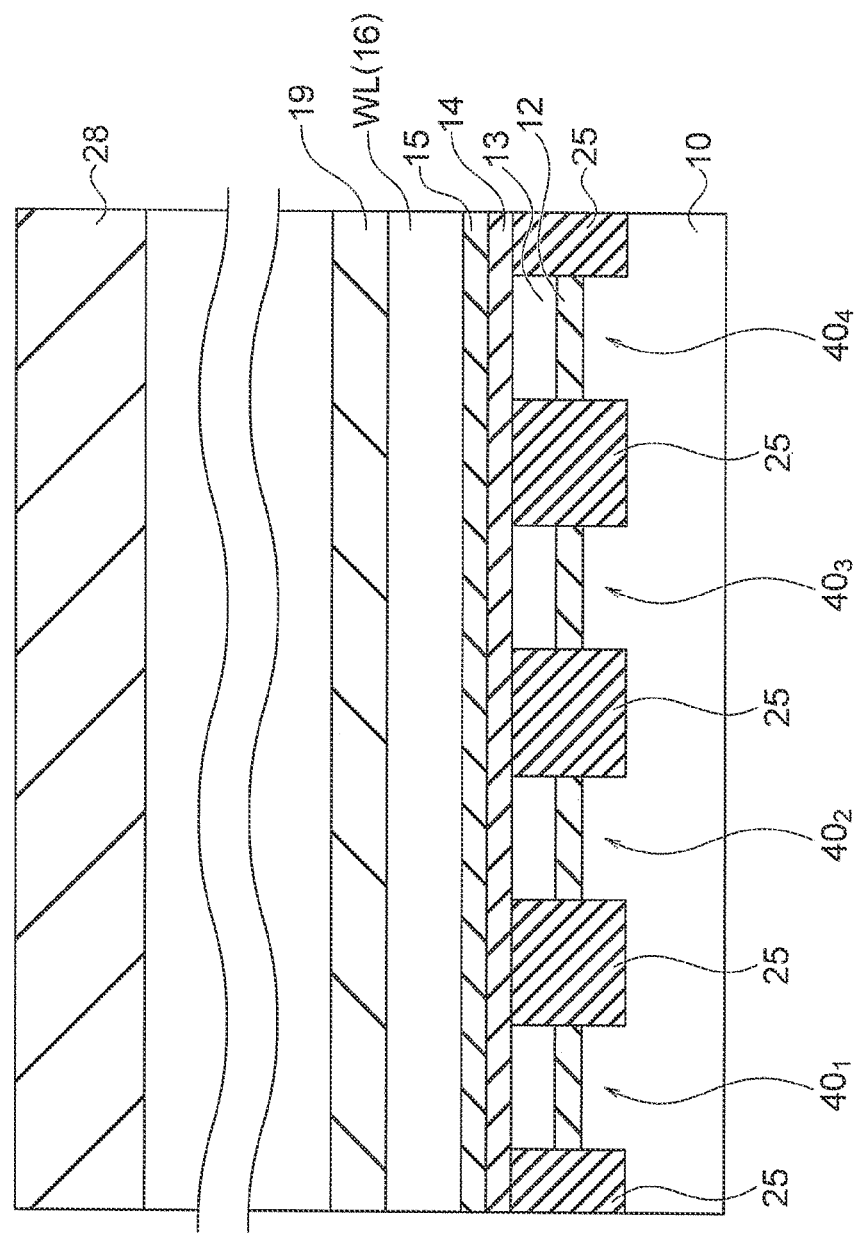
FIG. 12 is a cross-sectional view showing a nonvolatile semiconductor memory according to a modification of the first embodiment.

FIG. 12 is a cross-sectional view of the memory according to this modification, sectioned in the direction of the word line WL. Each memory cell in the memory according to this modification has a planar cell structure. FIG. 12 shows four NAND strings $40_1$-$40_4$ each isolated by a shallow trench isolation (STI) 25. Each of the memory cells constituting the NAND string includes a tunnel insulating film 12, a floating gate electrode 13, a hydrogen diffusion preventing film 14, an intergate insulating film 15, and a control gate electrode 16. The hydrogen diffusion preventing film 14, the intergate insulating film 15, and the control gate electrode 16 extend in the direction of the word line WL. An interlayer insulating film 19 is formed to cover the NAND strings $40_1$-$40_4$. A wiring layer that is not shown in FIG. 12 is formed on the interlayer insulating film 19. A silicon nitride film to serve as a protective film 28 is formed on the wiring layer.

The internal stress of the silicon nitride film to serve as the protective film 28 should be small in order to prevent the removal of film, with the barrier property against water etc. from outside being maintained.

The present inventors have found that the internal stress σ of a silicon nitride film formed by a well-known deposition method can be substantially expressed by the following expression (1) as a function of the composition ratio x of Si and N constituting the silicon nitride film and the film density.

$$(1-P-p_c)^\tau \qquad (1)$$

The above expression is derived based on the percolation theory, where P is the porosity, $p_c$ is the percolation threshold and expressed as $p_c$=0.55±0.05, τ is the critical exponent and expressed as τ=3.55±0.45. The porosity P is expressed by the following expression (2) using the actual film density ρ and the density $\rho_0(x)$ in the case where there is no vacancy at the composition ratio x.

$$P=1-\rho/\rho_0(x) \qquad (2)$$

The following expression (3) shows $\rho_0(x)$.

$$\rho_0(x)=\rho_{Si}\times(b+a\times(1-b)/(x+a)) \qquad (3)$$

where $\rho_{Si}$ is the density of Si crystal (g/cm³ and a and b, a=6.43, b=3.21, are parameters obtained by the respective atom amounts of Si and N and the respective densities of the Si crystal and the silicon nitride ($Si_3N_4$) crystal at a normal temperature under a normal atmospheric pressure.

As can be understood from the expression (1), the porosity P should be increased to decrease the internal stress τ of the silicon nitride film.

The present inventors have also studied the barrier property against water etc. introduced from outside, and have found that the barrier property of silicon nitride films can be generally described using the porosity P. It can be understood from the above relationship that the porosity P should be decreased to improve the barrier property.

From the foregoing, it is preferable that the porosity P on the surface side of the protective film 28 be smaller than that on the side of the semiconductor layer 10, and that composition ratio x satisfy the following condition.

$$0.7<x<0.9$$

The present inventors have also found that in a preferable protective film, the porosity P is less than 0.3 on the surface side of the silicon nitride film, and more than 0.175 on the side of the semiconductor layer 10.

The memory cells constituting the NAND string in this modification are according to the first embodiment. However, if a silicon nitride film satisfying the aforementioned condition of the porosity P is used as a protective film, well-known memory cells that do not have the hydrogen diffusion preventing film 14 can prevent the removal of film, maintaining the barrier property against water etc. introduced from outside.

The nonvolatile semiconductor memory according to this modification has the same effect as the nonvolatile semiconductor memory according to the first embodiment.

Furthermore, the hydrogen discharge film 20 according to the first embodiment can be provided on the interlayer insulating film 19 in this modification.

Although the charge storage film 13 of the memory cell is a floating gate electrode in the first embodiment and its modification, it can be a charge trapping film of an insulating material.

Second Embodiment

Figure 13:
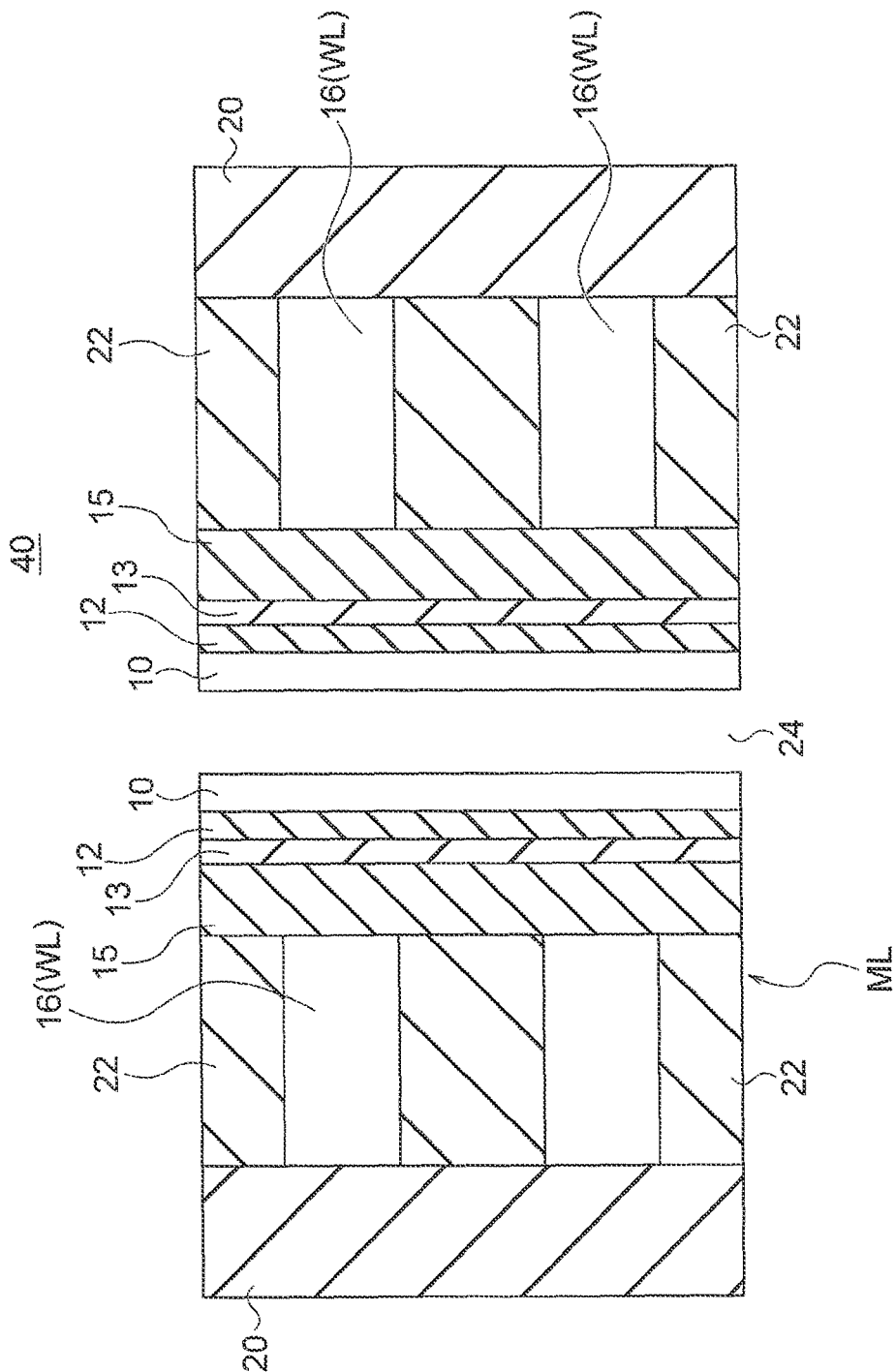
FIG. 13 is a cross-sectional view showing a nonvolatile semiconductor memory according to a second embodiment.

A nonvolatile semiconductor memory according to the second embodiment will be described with reference to FIG. 13. FIG. 13 is a cross-sectional view of a memory cell multilayer structure 40 of the nonvolatile semiconductor memory according to the second embodiment. The memory cell multilayer structure 40 constitutes one NAND string. The nonvolatile semiconductor memory is a three-dimensional stacked memory having a multilayer structure ML in which control gate electrode films 16 and interelectrode insulating films 22 are alternately stacked. A through-hole 24 penetrating the multilayer structure ML is formed at the central portion of the multilayer structure ML. A semiconductor layer (semiconductor region) 10 in a cylindrical shape extending in the direction along which the through-hole 24 extends is formed in the through-hole 24, and a tunnel insulating film 12 in a cylindrical shape is formed between the semiconductor layer 10 and the multilayer structure ML so as to extend in the direction along which the through-hole 24 extends. A charge storage film 13 in a cylindrical shape is formed between the tunnel insulating film 12 and the multilayer structure ML so as to extend in the direction along which the through-hole 24 extends. An insulating film 15 in a cylindrical shape is formed between the charge storage film 13 and the multilayer structure ML so as to extend in the direction along which the through-hole 24 extends. The outer periphery of the insulating film 15 is in contact with the inner periphery of the multilayer structure ML. A hydrogen discharge film 20 is formed to cover the outer periphery of the multilayer structure ML.

In this embodiment, the intergate insulating film 15 in a cylindrical shape is formed to cover the inner wall of the multilayer structure ML, and the charge storage film 13 in a cylindrical shape is formed to cover the inner wall of the intergate insulating film 15. Furthermore, the tunnel insulating film 12 in a cylindrical shape is formed to cover the inner wall of the charge storage film 13, and the semiconductor layer 10 in a cylindrical shape is formed to cover the inner wall of the tunnel insulating film 12. The semiconductor layer 10 may not be in a cylindrical shape, but can be a column shape. In this case, the through-hole 24 shown in FIG. 13 is filled with the semiconductor layer 10.

Besides the silicon oxide film, films formed of other materials can be used as the tunnel insulating film 12. For example, a tunnel insulating film having an oxide-nitride-oxide (ONO) structure can be used. In this case, the improvement in writing and erasing properties can be expected. An oxide-nitrideoxide-nitride-oxide (ONONO) structure in which two ONO structures are stacked, an oxide-silicon-oxide (OSO) structure including a Si-dot layer instead of the N layer, and an oxide-silicon-oxide-silicon-oxide (OSOSO) structure can also be used. If the ONONO structure, OSO structure, or OSOSO structure is used, more improvement in writing and erasing properties can be expected than in the case where the ONO structure is used. This is because of the band structure created on the charge storage film side, the band structure helping electrons be ejected from the charge storage film. As a result, the erasing is accelerated by the ejection of electrons in addition to the injection of holes. Incidentally, as in the second embodiment, a tunnel insulating film having the ONO structure, ONONO structure, OSO structure, or OSOSO structure can also be used as the tunnel insulating film 12 in the first embodiment.

The charge storage film 13 is formed of silicon-rich silicon nitride. This means that if silicon nitride is expressed as $Si_xN$, x is more than 0.75.

A lanthanum aluminum silicon oxide film is used as the insulating film 15. The control gate electrode 16 is formed of $n^+$ polycrystalline silicon. The interelectrode insulating film 22 is formed of tetra ethyl ortho silicate (TEOS).

A silicon layer containing crystalized amorphous silicon, for example, is used to form the semiconductor layer 10.

The material of the hydrogen discharge film 20 is the same as the material of the hydrogen discharge film 20 in the first embodiment. The hydrogen discharge film 20 does not necessarily cover the entire outer surface of the multilayer structure ML, but it should extend in the direction along which the through-hole 24 extends.

As in the case of the first embodiment, the film quality of the intergate insulating film of lanthanum aluminum silicon oxide can be improved in the second embodiment. As a result, the reliability of the memory cell can be improved. Since a silicon-rich silicon nitride film, which is highly densified, is used as the charge storage film, the hydrogen diffused from the insulating film 15 is blocked, and prevented from entering the tunnel insulating film 12. In this manner, it is possible to improve the reliability of the memory cell.

Third Embodiment

Figure 14:
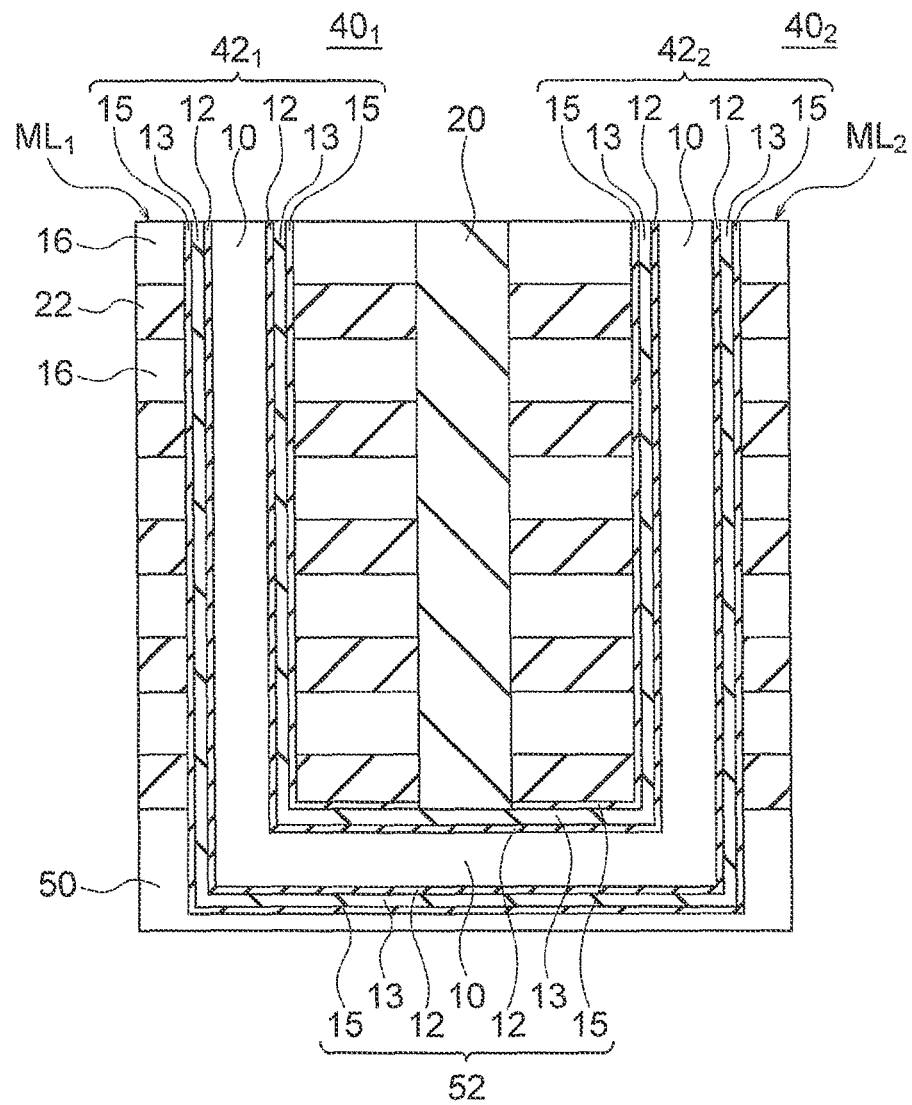
FIG. 14 is a cross-sectional view of a nonvolatile semiconductor memory according to a third embodiment.

A nonvolatile semiconductor memory according to the third embodiment will be described with reference to FIG. 14. FIG. 14 is a cross-sectional view of the nonvolatile semiconductor memory according to the third embodiment. This nonvolatile semiconductor memory is a three-dimensional stacked memory including two memory cell multilayer structures $40_1$, $40_2$ according to the second embodiment, the memory cell multilayer structures $40_1$, $40_2$ being spaced apart from each other on a substrate 50 and connected by a connecting portion 52 on the substrate 50 to form a NAND string.

Each memory cell multilayer structure $40_i$ (i=1, 2) has a multilayer structure $ML_i$ in which control gate electrode films 16 and interelectrode insulating films 22 are alternately stacked. A pillar $42_i$ (i=1, 2) penetrating the multilayer structure $ML_i$ is formed in the central portion of each multilayer structure $ML_i$ (i=1, 2). Each pillar $42_i$ (i=1, 2) includes a semiconductor layer 10 in a cylindrical shape, a tunnel insulating film 12 in a cylindrical shape that is formed between the multilayer structure $ML_i$ and the semiconductor layer 10, a charge storage film 13 in a cylindrical shape that is formed between the multilayer structure ML and the tunnel insulating film 12, and an insulating film 15 in a cylindrical shape that is formed between the multilayer structure $ML_i$ and the charge storage film 13.

The connecting portion 52 includes the semiconductor layer 10 in a cylindrical shape, the tunnel insulating film 12 in a cylindrical shape covering the outer surface of the semiconductor layer 10, the charge storage film 13 in a cylindrical shape covering the outer surface of the tunnel insulating film 12, and the insulating film 15 in a cylindrical shape covering the outer surface of the charge storage film 13.

In this embodiment, a hydrogen discharge film 20 is formed between the two memory cell multilayer structures $40_1$, $40_2$.

As in the second embodiment, the film quality of the intergate insulating film of lanthanum aluminum silicon oxide can be improved in the third embodiment. Accordingly, the reliability of the memory cell can be improved. Furthermore, since a silicon-rich silicon nitride film, which is highly densified, is used as the charge storage film, the hydrogen diffused from the insulating film 15 is blocked, and prevented from entering the tunnel insulating film 12. In this manner, it is possible to improve the reliability of the memory cell.

As described above, according to the respective embodiments, the defects in the insulating film 15 can be reduced, and the breakdown voltage can be increased. As a result, the breakdown voltage in the writing or erasing of the memory cell can be increased and the write saturation and the erase saturation can be suppressed. Furthermore, since the degradation of the tunnel insulating film is prevented, the degradation of data retaining property can be prevented, thereby improving the reliability of the memory cell.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory comprising:
   a multilayer structure in which control gate electrodes and interelectrode insulating films are alternately stacked, the multilayer structure having a through-hole extending in a stacking direction of the multilayer structure;
   a semiconductor region provided in the through-hole and extending in a direction along which the through-hole extends;
   a first insulating film provided between the semiconductor region and the multilayer structure;
   a charge storage film provided between the first insulating film and the multilayer structure;
   a second insulating film provided between the charge storage film and the multilayer structure; and
   a film provided on an outer periphery of the multilayer structure in a direction along which the through-hole extends, the film including a silicon nitride film with boron and extending along the control gate electrodes and interelectrode insulating films.

2. A memory according to claim 1, wherein the film has a density of 2.6 $g/cm^2$ or less.

3. A memory according to claim 1, wherein the semiconductor region has a column shape and the through-hole is filled with the semiconductor region.

4. A memory according to claim 1, wherein each of the first insulating film, the charge storage film, and the second insulating film has a cylindrical shape.

5. A memory according to claim 1, wherein the first insulating film has one of an Oxide-Nitride-Oxide structure, an Oxide-Nitride-Oxide-Nitride-Oxide structure, an Oxide-Silicon-Oxide structure, and an Oxide-Silicon-Oxide-Silicon-Oxide structure.

6. A memory according to claim 1, wherein the charge storage film contains $Si_xN$ (x>0.75).

7. A memory according to claim 1, wherein the second insulating film contains lanthanum aluminum silicon oxide.

8. A memory according to claim 1, wherein the semiconductor region contains crystallized amorphous silicon.

9. A memory according to claim 1, wherein the charge storage film contains boron-doped polycrystalline silicon.

* * * * *